United States Patent [19]

Soneda

[11] Patent Number: 4,839,863
[45] Date of Patent: Jun. 13, 1989

[54] MEMORY CELL CIRCUIT

[75] Inventor: Mitsuo Soneda, Kanagawa, Japan

[73] Assignee: Sony Corporation, Tokyo, Japan

[21] Appl. No.: 101,441

[22] Filed: Sep. 28, 1987

[30] Foreign Application Priority Data

Sep. 26, 1986 [JP] Japan ................................ 61-227447

[51] Int. Cl.$^4$ .............................................. G11C 11/00
[52] U.S. Cl. ..................................... 365/154; 365/190
[58] Field of Search ............... 365/154, 174, 190, 202, 365/203

[56] References Cited

U.S. PATENT DOCUMENTS 4,103,185  7/1978  Denes ............................. 365/156 X

FOREIGN PATENT DOCUMENTS 2262171   7/1974  Fed. Rep. of Germany ...... 365/154
58-147886 9/1983  Japan ................................. 365/154

*Primary Examiner*—Joseph A. Popek
*Attorney, Agent, or Firm*—Hill, Van Santen, Steadman & Simpson

[57] ABSTRACT

Memory cell circuit has a pair of transistors in which the gates are connected to the drains, a first and a second access transistor whose gates are connected to a read line and which are located between gate-drain connection of said pair of transistors and a pair of bit lines. The memory cell circuit also includes a third access transistor whose gate is connected to the read line and is located in the circuit between said first access transistor and the gate of said pair of transistors corresponding to the first access transistor, and a fourth access transistor whose gate is connected to the read line and is located in the circuit between said second access transistor and the gate of said pair of transistors corresponding to the second access transistor.

19 Claims, 1 Drawing Sheet

MEMORY CELL CIRCUIT

BACKGROUND OF THE INVENTION

1. Field of the Invention

The present invention relates generally to memory cell in a semiconductor integrated circuit. More specifically, the invention relates to a memory cell forming a semiconductor memory, such as DRAM and so forth.

2. Description of the Background Art

So-called gain cells, such as DRAMs, which is composed of the 4 transistors have been proposed. In the known art, a memory cell circuit has a pair of memory transistors. There memory transistors are connected between gates and drains to each other. The memory transistors also have sources which are commonly grounded. A first access transistor and a second access transistor are connected between gate-drain connections of the memory transistors and bit lines. The first and second access transistors have gates connected to a word line.

In the above described memory cell circuit, the first access transistor and the second access transistor are responsive to a selection signal input to the gates via the word line to perform switching operation. By this switching operation of the access transistors, ON/OFF control of the memory transistors is taken place. Also, by switching operation of the access transistors, output of the memory transistors to the bit lines are controlled.

However, in the above described memory cell circuit, there is a problem of channel leak between the transistors. That is, when channel leak occurs on the memory transistor and/or the access transistor, charge level at the gates of the memory transistor tends to be lowered. This causes change of stored data to bring an error of the data.

On the other hand, it is possible that substantial level of noise is superimposed on the signal in the bit lines. In this case, when the data are read from the above described memory cell circuit, the data which are stored in the gate of the each memory transistor can be alternated by the substantial level of the noise to reverse the stored information.

Moreover, nowadays, it has been strongly required to shorten access time for the integrated circuit, such as DRAMs and so forth.

SUMMARY OF THE INVENTION

Therefore, it is an object of the present invention to provide an improved memory cell circuit which realizes improvements in data holding characteristics and an enables quicker access operations.

In order to accomplish the aforementioned and other objects, a memory cell circuit, according to the invention, includes a pair of transistors connected between gates and drains to each other, a first access transistor and a second access transistor whose gates are connected to a read line and which is located in the circuit between gate-drain connections of said pair of transistors and a pair of bit lines, a third access transistor whose gate is connected to the read line and is located in the circuit between said first access transistor and gate of said pair of transistors corresponding to the first access transistor, and a fourth access transistor whose gate is connected to the read line and is located in the circuit between said second access transistor and the gate of said pair of transistors corresponding to the second access transistor.

In general, a value of channel leak I (leak) can be illustrated by:

$$I\text{ (leak)} \propto \exp(Vds)$$

in relation to a Vds which is voltage between a drain and a source. In a memory cell circuit of the invention, a third access transistor and a fourth access transistor as well as a first access transistor and a second access transistor are located between the gates of the pair of transistors and their bit lines, so that Vds can be divided. therefore, the channel leak is successfully reduced or eliminated.

If respective drains in the pair of memory transistors are connected to connections one of which is connected between the first and third access transistors and the other of which is connected between the second and fourth access transistors. The drains of the respective memory transistors are connected to respective bit lines via the respective first and second access transistors which are located near the bit lines when reading, amplification occurs. At that time, gates of respective memory transistors holding information signals are connected to said contacts via respective third and fourth access transistors, so that the information signals which are held in the memory transistors cannot possibly be destroyed and can be output.

If the drain of one of the pair of memory transistors is connected to the connection between the first and third access transistor, and the drain other of one is connected to the connection between the second and fourth access transistor, the data content can be held at a stated level at the connections and rapid read, etc will be realized. And as has been described above, the channel leak can be reduced, so that channel length can be shortened. If the channel length is shortened, speed of access can be increased.

According to one aspect of the invention, a memory cell circuit comprises first and second bit lines for transferring data therethrough, a word line through which a selection signal passes, first and second memory transistors having gates for storing data, the first and second memory transistors are commonly grounded via sources thereof and having drains, first means for connecting the drain of the first memory transistor to the gate of the second memory transistor, second means for connecting the drain of the second memory transistor to the gate of the firth memory transistor, third means connecting the first means to the first bit line, the third means incorporating a first access transistor and being connected to the word line to receive the selection signal to be responsive to the selection signal to be switched into conductive state, fourth means connecting the second means to the second bit line, the fourth means incorporating a second access transistor and being connected to the word line to receive the selection signal to be responsive to the selection signal to be switched into conductive state, a third access transistor connected to the word line to be switched into the conductive state in response to the selection signal, the third access transistor being connected in series to the first transistor in such a manner as to surpress channel leak of the potential in the first means, and a fourth access transistor connected to the word line to be switched into the conductive state in response to the selection signal, the fourth access transistor being connected in series to the second transistor in such a manner as to surpress channel leak of the potential in the second means.

In the preferred construction, the third access transistor is disposed within the first means. It is also possible to disposed the fourth access transistor within the second means.

In the alternative, the third access transistor is disposed within the third means. The fourth access transistor may also be disposed within the fourth means.

In order to form the aforementioned constructions of the memory cell circuit, the first and second memory transistors may comprise NMOS transistor. Further, the first, second, third and fourth access transistors may also comprise NMOS transistor.

Alternatively, the first and second memory transistors may comprise PMOS transistor. Similarly, the first, second, third and fourth access transistors may comprise PMOS transistor.

BRIEF DESCRIPTION OF THE DRAWINGS

The present invention will be understood more fully from the detailed description given herebelow and from the accompanying drawings of the preferred embodiment of the invention, which, however, should not be taken to limit the invention to the specific embodiment but are for explanation and understanding only.

In the drawings.

DESCRIPTION OF THE PREFERRED EMBODIMENT

Figure 1:
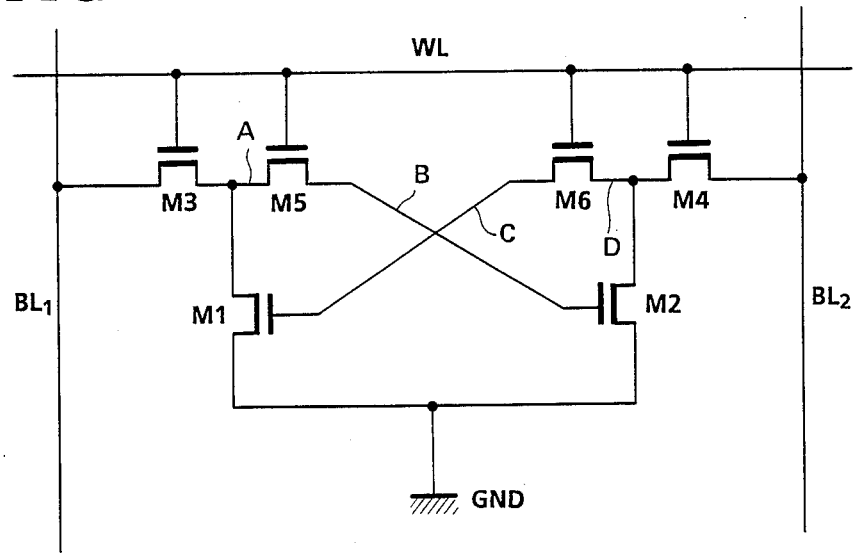
FIG. 1 is a circuit diagram which shows the structure of the memory cell circuit described the first embodiment of this invention.

Referring now to the drawings, particularly to FIG. 1, the first embodiment of a memory cell circuit, according to the present invention, has a pair of memory transistors M1 and M2, two pairs of access transistors M3, M4, M5 and M6. This embodiment of the memory cell circuit is intended to accomplish improved data holding characteristics and high speed read/write operation by connecting the drains of the memory transistors M1 and M2 to junctions between series of transistors M3, M5 and M4, M6.

The first embodiment of the memory cell circuit according to the invention is formed as showed in FIG. 1. The pair of memory transistors M1 and M2 respectively have sources are commonly connected to a ground. The memory transistor M1 also has a drain which is connected to a first bit line BL1 via a first access transistor M3. On the other hand, the memory transistor M2 has a drain connected to a second bit line BL2 via a second access transistor M4. Respective of first and second access transistors M3 and M4 have gates connected to a word line WL (read line). Furthermore, each of the first and second access transistors M3 and M4 has drain connected to the corresponding one of third access transistor M5 and fourth access transistor M6. The third and fourth access transistors M5 and M6 have gates connected to the word line WL. The drains of third and fourth access transistors M5 and M6 are connected to gates of respective diagonally opposing memory transistors M1 and M2.

Hereinafter, operation of the memory cell circuit is described.

When holding data, all of the access transistors M3, M4, M5 and M6 are held OFF. By this, the gates of the memory transistors M1 and M2 storing electric charge are disconnected from respectively associated bit lines $BL_1$ and $BL_2$. As a result, the electric charge as a data component can be held in the gates of the memory transistors M1 and M2. When a data is "1" (HIGH level) is stored in the gate of the memory transistor M2, an electric charge at point D, to which the potential at the drain of the memory transistor M2 is applied is necessarily held at ground (GND) level. At the same time, the electric potential of a point C is also held at GND level. Since the input at the gate is held at GND level, the memory transistor M1 is maintained at OFF position. At this position, the point B in the memory cell circuit of FIG. 1 is held at floating state because of the electric charge stored in the gate of the memory transistor M2.

In the conventional memory cell circuit, channel leak from the point B which is placed at the floating condition has raised a problem. Whereas, according to the shown embodiment, the channel leak can be successfully surpressed by providing the third access transistor M5. In order to accomplish surpression of the channel leak, the third access transistor M5 is provided in such a position that it is disposed between the points B and A, at which point A, the drain of the memory transistor M1 is connected between the drain of the first access transistor and the source of the third access transistor M5. By this, the third access transistor M5 divides the potential between the point B and point A.

As set forth above, the magnitude of the channel leak is exponentially related to the voltage at the junction (A) between the drain and the source of the transistors. Therefore, by dividing the voltage, the voltage at the drain-source connection of the transistors can be substantially reduced so that the value of the current leak can be reduced markedly.

Upon reading data, selection signal is applied to all of the gates of the access transistors M3, M4, M5 and M6 via the word line WL. As a result, the first to fourth access transistors M3, M4, M5 and M6 are turned ON. In response to turning ON of the first to fourth access transistors M3, M4, M5 and M6, latching operation is taken place to turn one of the memory transistors M1 and M2 OFF, which has lower charge in the gate and turn the other memory transistor ON, which has gate having higher charge. By this operation, data to be read out can be fixed.

During the aforementioned read out operation, the noise superimposing on the signal of bit lines $BL_1$ and $BL_2$ tends to influence to the data read out from the memory circuit, in the prior art. That is, when the noise is superimposed on the data of the bit lines BL1 and BL2, an error voltage can be enter the memory cell circuit. This error voltage tends to be directly applied to the gate of the memory transistor to give a damage to the data stored in the gate. However, in the shown embodiment, the memory transistor M1 is connected to the bit line $BL_1$ via the access transistors M3 and M5 and the memory transistor M2 is connected to the bit line $BL_2$ via the access transistors M4 and M6, so that the data content of the cell is protected sufficiently by the resistance when the access transistors M3, M4, M5 and M6 are held ON.

Moreover, in the preferred embodiment of the memory cell circuit, the electric potential of the point A and the point D which are connected to the drains of respective memory transistors M1 and M2. Therefore, the potential at the points A and D corresponds the data value stored in the memory transistors M1 and M2. Therefore, upon accessing the content of the memory transistors M1 and M2, the data value can be transferred via first and second access transistors M3 and M4 via the points A and D. This is substantially equivalent to that in the memory cell circuits in the prior art. Therefore, the presence of the third and fourth access transistors M5 and M6 which are successful to surppress channel leak for better data holding ability, will never degrade access speed of the memory cell circuit.

In addition, because of the improved data holding ability, the size, i.e. channel length, of the access transistors can be reduced. As will be appreciated, shorter channel length of the access transistors allows quicker access. Consequently, higher access speed can be achieved when the channel length of the first and the second access transistors is shortened. To this end, the intervals between refresh cycles can be made longer and the power consumption can be reduced.

As will be clear, the shown embodiment of the memory cell circuit is constituted of six transistors to require increased number of circuit component. However, since all of the transistors constituting the memory cell circuit can be NMOS transistors which requires smaller area to form than that required by CMOS transistor which requires well region and so forth, the overall area occupied by the first embodiment of the memory cell circuit can be equivalent or even smaller than that in the conventional ones.

It should be appreciated, though the shown embodiment of the memory cell circuit is described to be composed of the NMOS transistors, it would be possible to employ PMOS transistors to compose the equivalent circuit.

Figure 2:
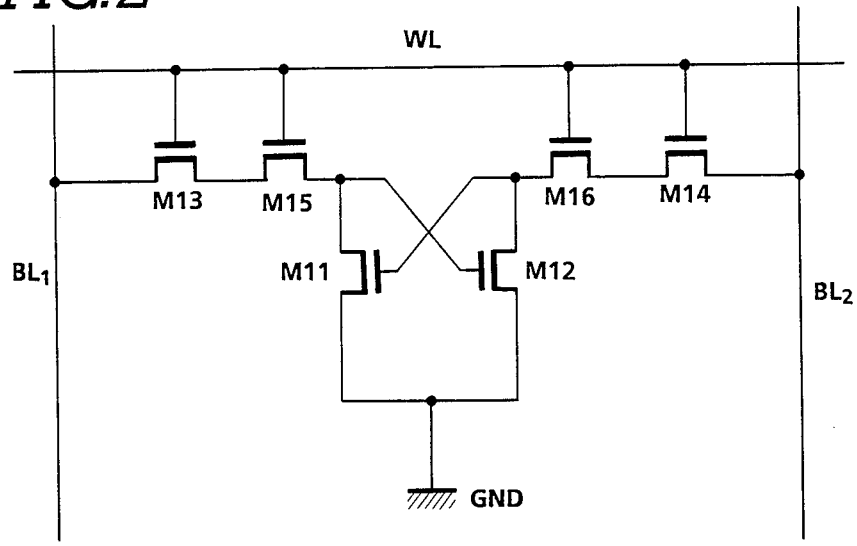
FIG. 2 is a circuit diagram which shows the other embodiment of the memory cell circuit structure of this invention.

FIG. 2 shows the second embodiment of the memory cell circuit in accordance with the present invention. This second embodiment of the memory cell circuit is formed as dual gates access transistor-type cell.

This memory cell circuit has a pair of memory transistors A11 and M12, the drain of the memory transistor M11 is connected to the gate of the memory transistor M12. Similarly, the drain of the memory transistor M12 is connected to the gate of the memory transistor M11. The sources of transistors M11 and M12 are commonly connected to a GND. A first and third access transistors M13 and M15 are disposed between a junction between the drain of the memory transistor M11 and the gate of the memory transistor M12, and the bit line $BL_1$. Likewise, second and fourth access transistors M14 and M15 are disposed between a junction between the drain of the memory transistor M12 and the gate of the memory transistor M11, and the bit line $BL_2$.

Similarly to the foregoing first embodiment, the memory transistors M11 and M12 and the first, second, third and fourth transistors M3, M4, M5 and M6 comprise NMOS transistors.

Even with the construction of the second embodiment set forth above, equivalent effect in surpressing channel leak and achieving high speed access can be realized. Though the shown embodiment employs the NMOS transistors, it would also be possible to employ the PMOS transistors as replacements of the NMOS transistors.

As set forth above, the memory cell transistor of this invention is provided with the third and the fourth access transistors. Therefore, the channel leak can be reduced exponentially and improvement of the data holding characteristics can be achieved. In a memory cell transistor, which comprises connections connected to the drains of a pair of transistors, one of the connections is connected between the first access transistor and the second access transistor and the other of connections is connected between the third access transistor and the fourth access transistor, the loss of the data due to an error voltage can be prevented and the rapid access operation can be achieved and the lower power demand of the refresh cycle of the memory cell circuit can be realized.

While the present invention has been disclosed in terms of the preferred embodiment in order to facilitate better understanding of the invention, it should be appreciated that the invention can be embodied in various ways without departing from the principle of the invention. Therefore, the invention should be understood to include all possible embodiments and modifications to the shown embodiments which can be embodied without departing from the principle of the invention set out in the appended claims.

What is claimed is:

1. A memory cell circuit comprising:
 first and second bit lines for transferring data therethrough;
 a word line through which a selection signal passes;
 first and second memory transistors having gates for storing data, said first and second memory transistors are commonly grounded via sources thereof and having drains;
 first means for connecting said drain of said first memory transistor to said gate of said second memory transistor;
 second means for connecting said drain of said second memory transistor to said gate of said first memory transistor;
 third means connecting said first means to said first bit line, said third means incorporating a first access transistor and being connected to said word line to receive said selection signal to be responsive to said selection signal to be switched into a conductive state;
 fourth means connecting said second means to said second bit line, said fourth means incorporating a second access transistor and being connected to said word line to receive said selection signal to be responsive to said selection signal to be switched into said conductive state;
 a third access transistor connected to said word line to be switched into the conductive state in response to said selection signal, said third access transistor being connected in series to said first access transistor in such a manner as to surpress channel leak of the potential in said first means;
 a fourth access transistor connected to said word line to be switched into the conductive state in response to said selection signal, said fourth access transistor being connected in series to said second access transistor in such a manner as to surpress channel leak of the potential in said second means.

2. A memory cell circuit as set forth in claim 1, wherein said third access transistor is disposed within said first means.

3. A memory cell circuit as set forth in claim 2, wherein said fourth access transistor is disposed within said second means.

4. A memory cell circuit as set forth in claim 3, wherein said first and second memory transistors comprise NMOS transistor.

5. A memory cell circuit as set forth in claim 4, wherein said first, second, third and fourth access transistors comprise NMOS transistor.

6. A memory cell circuit as set forth in claim 3, wherein said first, second, third and fourth access transistors comprise NMOS transistor.

7. A memory cell circuit as set forth in claim 3, wherein said first and second memory transistors comprise PMOS transistor.

8. A memory cell circuit as set forth in claim 7, wherein said first, second, third and fourth access transistors comprise PMOS transistor.

9. A memory cell circuit as set forth in claim 3, wherein said first, second, third and fourth access transistors comprise PMOS transistor.

10. A memory cell circuit as set forth in claim 1, wherein said fourth access transistor is disposed within said second means.

11. A memory cell circuit as set forth in claim 1, wherein said third access transistor is disposed within said third means.

12. A memory cell circuit as set forth in claim 11, wherein said fourth access transistor is disposed within said fourth means.

13. A memory cell circuit as set forth in claim 12, wherein said first and second memory transistors comprise NMOS transistor.

14. A memory cell circuit as set forth in claim 13, wherein said first, second, third and fourth access transistors comprise NMOS transistor.

15. A memory cell circuit as set forth in claim 12, wherein said first, second, third and fourth access transistors comprise NMOS transistor.

16. A memory cell circuit as set forth in claim 12, wherein said first and second memory transistors comprise PMOS transistor.

17. A memory cell circuit as set forth in claim 16, wherein said first, second, third and fourth access transistors comprise PMOS transistor.

18. A memory cell circuit as set forth in claim 12, wherein said first, second, third and fourth access transistors comprise PMOS transistor.

19. A memory cell circuit as set forth in claim 1, wherein said fourth access transistor is disposed within said fourth means.

* * * * *